United States Patent
Umezawa et al.

(10) Patent No.: US 10,388,386 B2
(45) Date of Patent: Aug. 20, 2019

(54) SEMICONDUCTOR DEVICE INCLUDING CONTROL CIRCUIT WRITING DATA TO MEMORY CELL

(71) Applicant: Toshiba Memory Corporation, Minato-ku (JP)

(72) Inventors: Yusuke Umezawa, Yokohama (JP); Shigeru Kinoshita, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/698,167

(22) Filed: Sep. 7, 2017

(65) Prior Publication Data
US 2018/0082751 A1 Mar. 22, 2018

(30) Foreign Application Priority Data

Sep. 16, 2016 (JP) .................. 2016-182385

(51) Int. Cl.
*G11C 7/00* (2006.01)
*G11C 16/34* (2006.01)
(Continued)

(52) U.S. Cl.
CPC .............. *G11C 16/34* (2013.01); *G11C 5/147* (2013.01); *G11C 8/08* (2013.01); *G11C 16/045* (2013.01); *G11C 16/0483* (2013.01); *G11C 16/08* (2013.01); *G11C 16/10* (2013.01); *G11C 16/105* (2013.01); *G11C 16/26* (2013.01);
(Continued)

(58) Field of Classification Search
CPC ........... G11C 16/34; G11C 8/08; G11C 16/10; G11C 29/12005; G11C 5/147; G11C 16/0483; G11C 16/045; G11C 16/30; G11C 16/26; G11C 16/105; G11C 16/08;
(Continued)

(56) References Cited

U.S. PATENT DOCUMENTS

| 8,174,893 B2 * | 5/2012 | Goda ................... G11C 16/10 365/185.17 |
| 2009/0034337 A1 * | 2/2009 | Aritome ............. G11C 11/5642 365/185.18 |

(Continued)

FOREIGN PATENT DOCUMENTS

| JP | 2011-96340 | 5/2011 |
| JP | 2016-170836 | 9/2016 |

*Primary Examiner* — Tha-o H Bui
(74) *Attorney, Agent, or Firm* — Oblon, McClelland, Maier & Neustadt, L.L.P.

(57) ABSTRACT

A semiconductor device includes first and second memory cells, a first word line, and a first and second bit lines, and a row control circuit. The first memory cell has a first gate electrode and a first channel having one end and another end. The second memory cell has a second gate electrode and a second channel having one end and another end. The first word line electrically connected with each of the first gate electrode and the second gate electrode. The first and second bit lines electrically connected with the first and second channels, respectively. When a threshold voltage of each of the first and second memory cells are caused to be shifted, the semiconductor device causes a first voltage between the first gate electrode and the first channel and a second voltage between the second gate electrode and the second channel to be differentiated.

17 Claims, 7 Drawing Sheets

(51) Int. Cl.
  *G11C 16/04*    (2006.01)
  *G11C 16/08*    (2006.01)
  *G11C 16/10*    (2006.01)
  *G11C 16/26*    (2006.01)
  *G11C 16/30*    (2006.01)
  *G11C 5/14*     (2006.01)
  *G11C 8/08*     (2006.01)
  *G11C 29/12*    (2006.01)
  *H01L 27/1157*  (2017.01)
  *H01L 27/11582* (2017.01)

(52) U.S. Cl.
  CPC ........ *G11C 16/30* (2013.01); *G11C 29/12005* (2013.01); *H01L 27/1157* (2013.01); *H01L 27/11582* (2013.01); *G11C 2029/1204* (2013.01)

(58) Field of Classification Search
  CPC ....... G11C 2029/1204; H01L 27/11582; H01L 27/1157
  USPC ........................................................ 365/222
  See application file for complete search history.

(56) References Cited

U.S. PATENT DOCUMENTS

| | | | |
|---|---|---|---|
| 2010/0054036 A1* | 3/2010 | Lee ..................... | G11C 11/5628 365/185.03 |
| 2011/0090739 A1* | 4/2011 | Goda ................. | G11C 16/0483 365/185.18 |
| 2011/0103153 A1 | 5/2011 | Katsumata et al. | |
| 2012/0014159 A1* | 1/2012 | Song ................... | H01L 27/0207 365/145 |
| 2013/0322170 A1* | 12/2013 | Goldman ............... | G11C 16/28 365/185.03 |
| 2016/0267991 A1 | 9/2016 | Hashimoto et al. | |

* cited by examiner

FIG. 7

SEMICONDUCTOR DEVICE INCLUDING CONTROL CIRCUIT WRITING DATA TO MEMORY CELL

CROSS-REFERENCE TO RELATED APPLICATIONS

This application is based upon and claims the benefit of priority from Japanese Patent Application No. 2016-182385, filed on Sep. 16, 2016; the entire contents of which are incorporated herein by reference.

FIELD

Embodiments described herein relate generally to a semiconductor device.

BACKGROUND

In a rewritable non-volatile semiconductor memory device that is highly integrated, a word line is used in a manner that is shared among a plurality of memory cells. The word line is driven by a driver that is integrated. When a length of the word line changes, a resistance value or parasitic capacitance of the word line changes. For this reason, a voltage waveform that varies with a position thereof is applied to a memory cell.

A difference in a waveform of a voltage that is applied to the memory cell at the time of data programming causes dispersion in an amount of shift of a threshold voltage of the memory cell, and has an influence on stability of operation of a product.

In recent years, progress in high integration has been made, and a three-dimensionally structured NAND memory has progressed to a mainstream memory. Thus, dispersion in a threshold voltage in the direction of stacking memory cells has had an influence on stability of operation of a product as well.

DETAILED DESCRIPTION

A semiconductor device according to an embodiment includes a first memory cell, a second memory cell, a first word line, a first bit line, a second bit line, a source line, and a row control circuit. The first memory cell has a first gate electrode and a first channel having one end and another end. The second memory cell has a second gate electrode and a second channel having one end and another end. The first word line electrically connected with each of the first gate electrode and the second gate electrode. The first bit line electrically connected with the one end of the first channel. The second bit line electrically connected with the one end of the second channel. The source line electrically connected with each of the other end of the first channel and the other end of the second channel. The row control circuit adapted to supply the first word line with a first program voltage. When a threshold voltage of each of the first memory cell and the second memory cell is caused to be shifted, the semiconductor device causes a first voltage between the first gate electrode and the first channel and a second voltage between the second gate electrode and the second channel to be differentiated.

A semiconductor device according to another embodiment includes a first memory cell, a second memory cell, a first word line, a first bit line, a second bit line, a source line, a row control circuit, and a column control circuit. The first memory cell has a first gate electrode and a first channel having one end and another end. The second memory cell has a second gate electrode and a second channel having one end and another end. The first word line electrically connected with each of the first gate electrode and the second gate electrode. The first bit line electrically connected with the one end of the first channel. The second bit line electrically connected with the one end of the second channel. The source line electrically connected with each of the other end of the first channel and the other end of the second channel. The row control circuit includes a row driver connected with the first word line. The column control circuit includes a first circuit connected with the first bit line and a second circuit connected with the second bit line. The first circuit includes a first driver and a compensation voltage generating circuit that are serially connected between a power source voltage and ground electric potential. The output of the first driver connected with the first bit line. The output of the compensation voltage generating circuit connected with a ground electric potential side power source terminal of the first driver.

An embodiment will be described below with reference to the drawings. It is noted that the same element is given the same reference numeral in each drawing. A semiconductor device of the embodiment is a semiconductor memory device that has a memory cell array.

Figure 1:
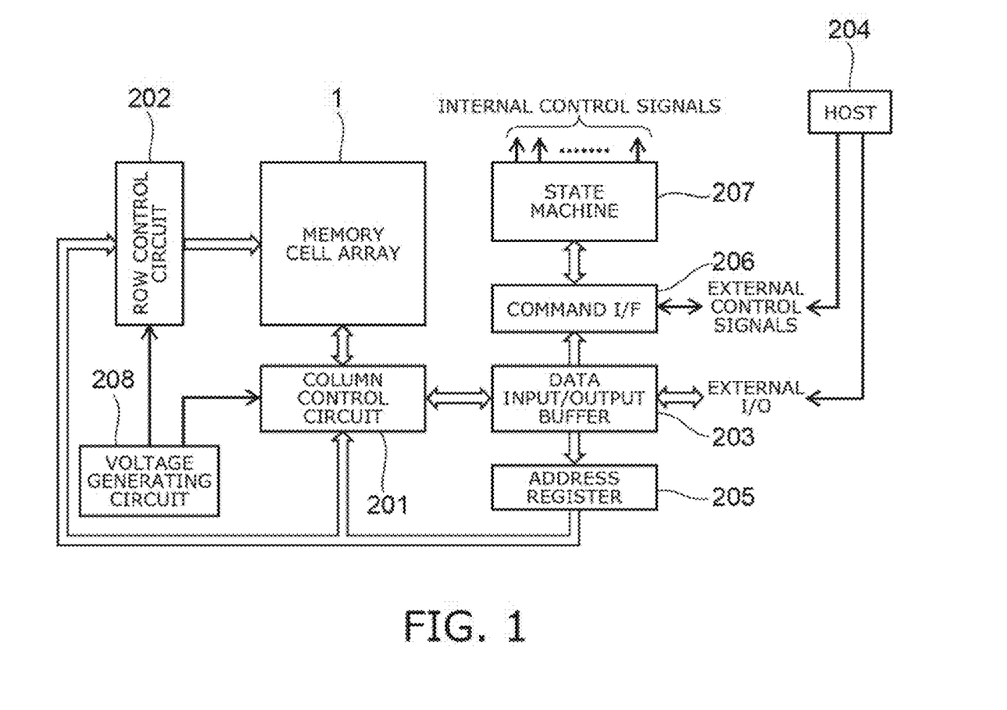
FIG. 1 is a schematic block diagram of a semiconductor device of an embodiment.

FIG. 1 is a schematic block diagram of a semiconductor device of an embodiment. As illustrated in FIG. 1, the semiconductor device includes a memory cell array 1. For example, a bit line BL, a word line WL, a source line SL, a drain-side selection transistor STD, a memory cell MC, and a source-side selection transistor STS are included in the memory cell array 1.

A column control circuit 201 and a row control circuit 202 are provided in the vicinity of the memory cell array 1. The column control circuit 201 controls electric potential of each of the bit line BL and the source line SL, and performs data erasing from the memory cell MC, data writing to the memory cell MC, and data reading from the memory cell MC.

The row control circuit 202 selects the word line WL, assigns electric potential that is necessary for the data erasing from the memory cell MC, the data writing to the memory cell MC, and the data reading from the memory cell MC to gate electrodes of the drain-side selection transistor STD, the memory cell MC, and the source-side selection transistor STS.

A data input/output buffer 203 receives external I/O data from an external host 204. The data input/output buffer 203 performs receiving of writing data, receiving of command data, receiving of address data, and outputting of reading data to the outside.

The data input/output buffer 203 sends the received writing data to the column control circuit 201. The column control circuit 201 sends the reading data from the memory cell array 1 to the data input/output buffer 203. The data input/output buffer 203 outputs the received reading data to the outside.

The data input/output buffer 203 sends the received address data to an address register 205. The address register 205 sends the received address data to the column control circuit 201 and the row control circuit 202.

A command interface (a command I/F) 206 receives an external control signal from the host 204. Based on the received external control signal, the command interface (the command I/F) 206 determines whether data that is received from the data input/output buffer 203 is the writing data, the command data, or the address data. If the data that is received by the data input/output buffer 203 is the command data, the command interface 206 sends the received command data, as a command signal, to a state machine 207.

The state machine 207 manages operation of an entire semiconductor device. The state machine 207 receives the command data from the host 204 through the command interface 206 and outputs an internal control signal. Accordingly, for example, the writing, the reading, erasing, managing of data input/output, and the like are performed. Based on the internal control signal, a voltage generating circuit 208 generates an internal voltage necessary for a writing operation, a reading operation, and an erasing operation. The state machine 207 manages status information. The status information can also be sent to the host 204. By receiving the status information, the host 204 can determine a situation of and a result of the operation of the semiconductor device.

Figure 2:
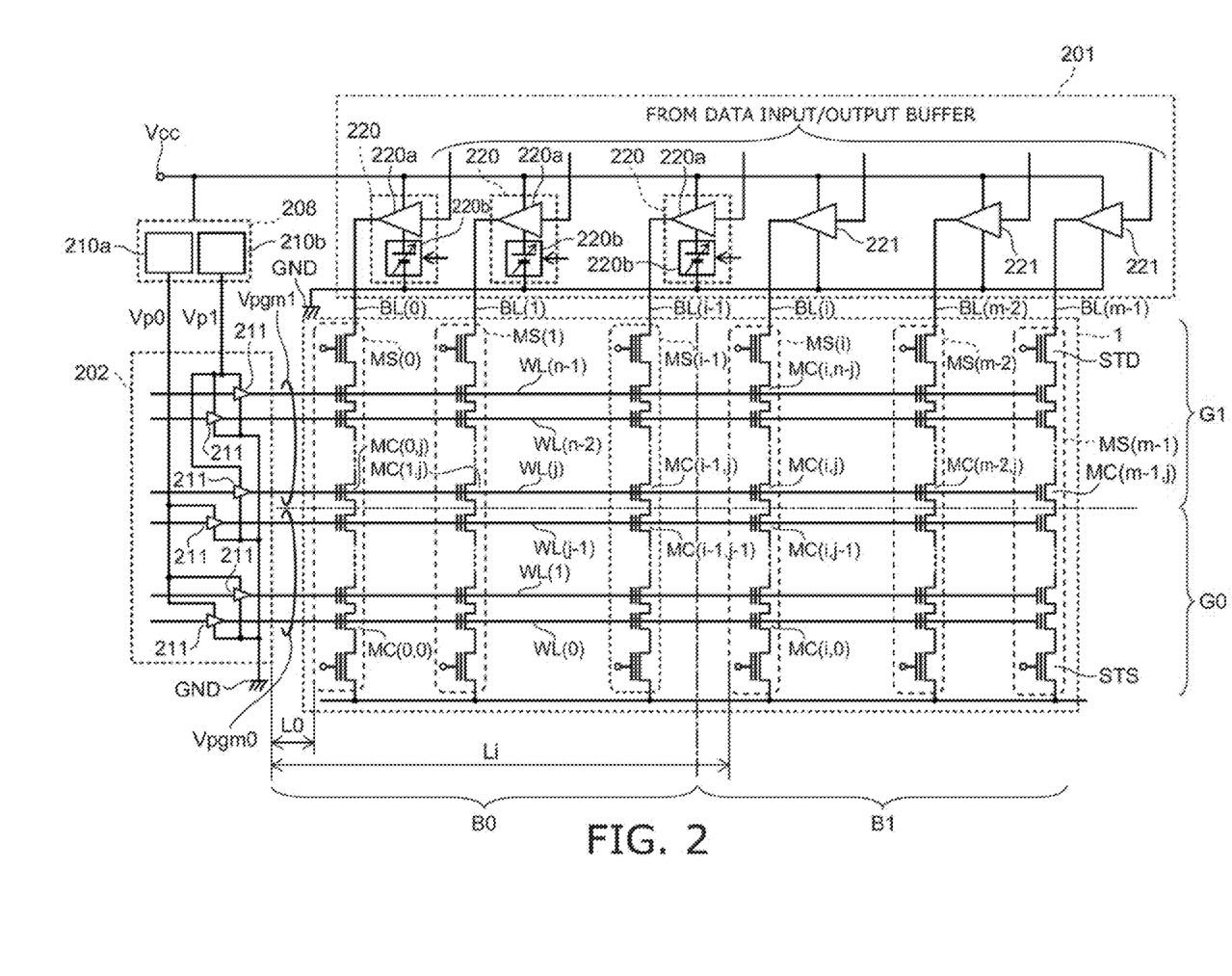
FIG. 2 is a block diagram illustrating one portion of the semiconductor device of the embodiment.

FIG. 2 is a block diagram illustrating one portion of the semiconductor device of the embodiment. Illustrated in FIG. 2 are an equivalent circuit of one portion of the memory cell array 1, one portion of the column control circuit 201, one portion of the row control circuit 202, and the voltage generating circuit 208.

As illustrated in FIG. 2, the memory cell array 1 includes a plurality of memory strings MS. The memory string MS includes the memory cells MC that are serially connected with each other. The source-side selection transistor STS is connected between one memory cell that is one end of the plurality of memory cells MC serially connected with each other and the source line SL. The drain-side selection transistor STD is connected between one memory cell that is the other end of the plurality of memory cells MC serially connected with each other and a bit line BL(i).

The source-side selection transistor STS, each memory cell MC, and the drain-side selection transistor STD, as will be described in detail below, are electrically and serially connected with each other by a channel that is formed in a semiconductor body. The bit line BL(i) is electrically connected with the channel that is formed in the semiconductor body.

In this example, m bit lines BL(i) are provided. i is an integer that ranges from 0 to m−1. Each bit line BL(i) is connected with the output of the column control circuit 201.

In the memory cell array 1, for example, one memory string MS (i+1) is connected with a word line WL(j) to which an adjacent memory string MS(i) is connected. More precisely (j+1)-th word line WL(j) is used in a shared manner by a different memory string MS(i). In this example, there is provided n word lines WL(j). j is an integer that ranges from 0 to n−1.

The word line WL(j) is connected with the output of the row control circuit 202. The row control circuit 202 applies a voltage to every word line WL(j).

The column control circuit 201 and the row control circuit 202 are disposed in a neighboring part of the memory cell array 1. In this example, the row control circuit 202 is provided in a position that is adjacent to the first memory string MS(0). The second memory string MS(1) is provided to be adjacent to the first memory string MS(0). More precisely, the first memory string MS(0) is provided between the second memory string MS(1) and the row control circuit 202.

The m-th memory string MS(m−1) is provided in the position that is the farthest from the row control circuit 202. The (m−1)-th memory string MS(m−2) is disposed to be adjacent to the m-th memory string MS(m−1). Although not illustrated, the (m−2)-th memory string MS(m−3) is disposed to be adjacent to the (m−1)-th memory string MS(m−2), and the (m−1)-th memory string MS(m−2) is positioned between the m-th memory string MS(m−1) and the (m−2)-th memory string MS(m−3).

In other words, a distance L0 from the row control circuit 202 to the first memory string MS(0) is shorter than a distance Li from the row control circuit 202 to the memory string MS(i). At this point, i is an integer that is greater than 1.

A memory cell MC(i, j) of the memory string MS(i) is connected by a gate electrode to the word line WL(j). More precisely, memory cells MC(0, j) to MC(m−1, j) are electrically connected with the same word line WL(j). A distance between the row control circuit 202 and the memory string MS(i) is almost the same as a length of the word line WL(j) that is provided between the row control circuit 202 and the memory cell MC(i, j). For example, a length of a word line WL(0) from the row control circuit 202 to a memory cell MC(0, 0) is shorter than a length of a word line WL(0) from the row control circuit 202 to the memory cell MC(i, 0).

For this reason, in a case where a width and a thickness of the word line WL(0) are fixed, a resistance value of the word line WL(0) from the row control circuit 202 to the memory cell MC(0, 0) is lower than a resistance value of the word line WL(0) from the row control circuit 202 to the memory cell MC(i, 0).

In the semiconductor device of the embodiment, the memory cell array 1 includes two groups B0 and B1 In the memory strings MS. The two groups B0 and B1 are set with a separation distance from the row control circuit 202 in the memory string MS. The group B0 includes memory strings MS(0) to MS(i−1) that are disposed in a position, of which a distance from the row control circuit 202 is shorter than in the case with the group B1. A length of a word line that is connected with memory cells MC(0, j) to MC(i−1, j) in the group B0 is set to be shorter than a length of a word line that is connected with the memory cells MC(i, j) to MC(m−1, j) in the group B1.

The groups B0 and B1 each include the memory strings MS(i−1) and MS(i) that are adjacent to each other. A border between the groups B0 and B1 is arbitrarily set. For example, in a case where the memory cell array 1 includes m memory strings, the group B0 may be set to range from the first memory string, of which a distance from the row control circuit 202 is short, to the m/2-th memory string, and the group B1 may be set to range from the (m/2+1)-th memory string to the m-th memory string.

The column control circuit 201 of the semiconductor device of the embodiment includes column drivers 220 and 221 that are connected with bit lines BL(0) to BL(m−1). The output of the column driver 220 is connected with the bit line BL(0) to a bit line BL(i−1) in the group B0. The output of the column driver 221 is connected with the bit lines BL(i) to BL(m−1) in the group B1.

The column driver 220 includes a driver 220a and a compensation voltage generating circuit 220b. The driver 220a and the compensation voltage generating circuit 220b are serially connected with each other. In this example, a serial circuit that results from the serially connecting of the driver 220a and the compensation voltage generating circuit 220b is connected between a power source voltage Vcc and ground electric potential GND. The ground electric potential GND, for example, is the lowest electric potential of the semiconductor device. The power source voltage Vcc and the ground electric potential GND are supplied from an external power source apparatus (not illustrated).

The compensation voltage generating circuit 220b outputs a compensation voltage Vcmp that is set in advance. The output of the compensation voltage generating circuit 220b is connected with a ground electric potential side power source terminal of the driver 220a. The compensation voltage Vcmp is set to be in a range from the ground electric potential GND to the power source voltage Vcc. For example, the compensation voltage Vcmp is set to range from approximately 0.1% to several percent of a program voltage Vpgm that is applied to a gate electrode of the memory cell MC (i,j). For example, in a case where the program voltage Vpgm is 20 V, Vcmp, for example, is 0.2 V.

The compensation voltage Vcmp that is output by the compensation voltage generating circuit 220b may be made to be arbitrarily set with an external signal. As will be described, the compensation voltage Vcmp can be set to a suitable value according to the resistance value that results from the length of the word line WL(j).

Moreover, in the semiconductor device of the embodiment, the compensation voltage Vcmp can also be set according to the memory cell MC in the same memory string MS. For example, the compensation voltage Vcmp in a case where the writing to the memory cell MC(i, j) in the word line WL(j) is performed can be set to be at a higher voltage than the compensation voltage Vcmp in a case where the writing to a memory cell MC(i, j−1) in a word line WL (j−1) that is one layer below is performed. In the same manner, the compensation voltage Vcmp in a case where the writing to a memory cell MC in a word line WL in an upper layer is performed can be set to be at a higher voltage. More precisely, the compensation voltage Vcmp relating to one bit line BL can change a value that is set for every word line WL for writing data.

The column driver 220 drives the bit lines BL(0) to BL(i−1) according to data that is input. A high level and a low level of a drive voltage of the bit lines BL(0) to BL(i−1), for example, are the power source voltage Vcc and the compensation voltage Vcmp, respectively.

The column driver 221 may be the same as the driver 220a. The column driver 221 drives the bit lines BL(i) to BL(m−1). A high level and a low level of a drive voltage of the bit lines BL(i) to BL(m−1), for example, are the power source voltage Vcc and the ground electric potential GND, respectively.

At the time of data programming, the column drivers 220 and 221 set a bit line that is selected, to be a low level (writing selection). The column drivers 220 and 221 set a non-selected bit line to be at a high level (writing suppression).

The memory cell MC(i, j), as will be described below, is formed as a result of memory cells being stacked along with the word line WL(j). The word line WL(j) is connected with the memory cell MC(i, j) in a different memory string MS(i) in the same layer. The memory cell array 1 includes groups G0 and G1. The two groups G0 to G1 are the group G0 of the lower layer and the group G1 of the upper layer.

The row control circuit 202 includes a row driver 211 that is connected with every word line WL(j). A power is supplied from the voltage generating circuit 208 to the row driver 211. The voltage generating circuit 208 includes a first pump circuit 210a and a second pump circuit 210b. The first pump circuit 210a and the second pump circuit 210b, for example, are provided with power from the power source voltage Vcc, and output a predetermined voltage.

A pump voltage Vp0 is supplied from the first pump circuit 210a to the row driver 211 in the group G0 of the lower layer. A pump voltage Vp1 is supplied from the second pump circuit 210b to the row driver 211 of the group G1 of the upper layer.

At the time of data programming, the program voltage Vpgm is applied to one selected word line WL. A pass voltage Vpass is applied to the remaining word lines, that is, the non-selection word lines WL. The pass voltage Vpass is a voltage that causes the memory cell MC to conduct electricity regardless of a threshold voltage thereof. The pass voltage Vpass, for example, is a voltage between the program voltage Vpgm and the ground electric potential GND.

In the embodiment, an example is described in which a value of the program voltage Vpgm varies with the word lines WL(0) to WL(j−1) that are connected with the memory cell MC in the group G0 of the lower layer, and the word lines WL(j) to WL(n−1) that are connected with the memory cell MC in the group G1 of the upper layer. A voltage Vpgm0 is applied, as the program voltage Vpgm, to the memory cell MC in the group G0 of the lower layer. A voltage Vpgm1 is applied, as the program voltage Vpgm, to the memory cell MC in the group G1 of the upper layer. The voltage Vpgm0, for example, is lower than the voltage Vpgm1. The voltage Vpgm0, for example, is obtained based on a voltage Vp0 that is output by the first pump circuit 210a. The voltage Vpgm1, for example, is obtained based on a voltage Vp1 that is output by the second pump circuit 210b.

Furthermore, at the time of data programming, it is also possible that step-up writing is used. The step-up writing, for example, is one of writing techniques that is devised such that, for example, although threshold voltage is not easy to shift, the writing is performed in the cell. With the step-up writing, the program voltage Vpgm is raised each time a "writing to writing verify" cycle is repeated. For example, the program voltage Vpgm is raised by ΔV. In the embodiment, the program voltage Vpgm0 that is applied to the word lines WL(0) to WL(j−1) is raised at each cycle, for example, in such a manner that the program voltage Vpgm0 is sequentially increased to "Vpgm0+ΔV", "Vpgm0+2·ΔV", "Vpgm0+3·ΔV", and so forth. In the same manner, the program voltage Vpgm1 that is applied to the word lines WL(j) to WL(n−1) is raised at each cycle, for example, in such a manner that the program voltage Vpgm1 is sequentially increased to "Vpgm1+ΔV", "Vpgm1+2·ΔV", "Vpgm1+3·ΔV", and so forth. In the embodiment, it is also possible that the step-up writing is used.

Additionally, in the semiconductor device of the embodiment, for example, with the group B0 in the memory string MS that is disposed in a position that is near the row control circuit 202, and the group B1 In the memory string MS that is disposed in a position that is remote from the row control circuit 202, different voltages are supplied to the bit line BL that is selected for writing.

In the embodiment, at the time of data programming, a voltage of the bit line BL, for example, is controlled as follows.

<Group B0>
Writing Selection: Vcmp
Writing Suppression: Vcc
<Group B1>
Writing Selection: GND
Writing Suppression: Vcc In this manner, a voltage that is applied between a gate electrode of the memory cell MC (the word line) in the group B0 and the semiconductor body is decreased to be lower by the compensation voltage Vcmp than a voltage that is applied between a gate electrode of the memory cell in the group B1 and the semiconductor body.

Generally, it is indicated that
the more lengthened the time (an effective writing pulse width) for which the effective program voltage Vpgm is applied, the larger a quantity of electrons that are implanted into the memory cell MC tends to be.

Normally, the effective writing pulse width changes with a time constant RC of the word line WL. For example, the effective writing pulse width of the group B0 that is near the row control circuit 202 is larger than the effective writing pulse width of the group B1 that is remote from the row control circuit 202. For this reason, the quantity of electrons that are implanted into the memory cell MC in the group B0 is larger than the quantity of electrons that are implanted into the memory cell MC in the group B1.

Considering this situation, in the embodiment, for example, the compensation voltage Vcmp that is higher than the ground electric potential GND is supplied to the bit line BL in the group B0, and for example, the ground electric potential GND is supplied to the bit line BL in the group B0. Accordingly, in the embodiment, a voltage of a channel of the memory cell MC that is selected for writing is as follows.

<Group B0>
Writing Selection: approximately Vcmp
Writing Suppression: Vboost
<Group B1>
Writing Selection: approximately GND
Writing Suppression: Vboost In the case of the writing suppression, the voltage of the bit line BL, for example, is set to be the power source voltage Vcc. In this case, the drain-side selection transistor STD is cut off. For this reason, the channel of the memory cell MC electrically floats. The electrically-floating channel is coupled to the word line WL to which the pass voltage Vpass or the program voltage Vpgm is applied, and the voltage of the channel is increased to a boost voltage Vboost. The boost voltage Vboost, for example, is higher than the power source voltage Vcc.

In the case of the writing selection, the voltage of the bit line BL is set to be the compensation voltage Vcmp or the ground electric potential GND. In this case, the drain-side selection transistor STD is turned on. Accordingly, a voltage that is approximately the compensation voltage Vcmp, or a voltage that is approximately the ground electric potential GND is transferred to the channel.

It is indicated that "the greater a difference in electric potential between the channel and the gate electrode (the word line)," the larger the quantity of electrons that are implanted into the memory cell MC tends to be. In accordance with this tendency, the quantity of electrons that are implanted into the memory cell MC in the group B0, in which the voltage of the channel is approximately the compensation voltage Vcmp is reduced.

In this manner, according to the embodiment in which it is possible that the quantity of electrons that are implanted into the memory cell cell MC in the group B0 is reduced, it is possible that the quantity of electrons that are implanted into the memory cell MC in the group B0 is made to be close to the quantity of electrons that are implanted in the memory cell MC in the group B1. Therefore, dispersion between a threshold voltage of the memory cell MC in the group B0 and a threshold voltage of the memory cell MC in the group B1 can be decreased, dispersion in the threshold voltage of the memory cell MC after data is written can be suppressed from being increased.

Furthermore, in the semiconductor device of the embodiment, the program voltage Vpgm0 that is applied to a gate electrode of the group G0 to which the memory cell that is formed in the lower layer belongs is set to a value that is lower than the program voltage Vpgm1 that is applied to a gate electrode of the group G1 of the upper layer. Therefore, the threshold voltage of the memory cell in the group G0 of the lower layer is suppressed from being greatly shifted to the positive side, and thus can also be set to be approximately an amount of shift in the threshold voltage of the memory cell in the group G1 of the upper layer.

In the above description above, the division into the groups B0 and B1 is performed and a voltage of the bit line that is selected for writing is set to be the compensation voltage Vcmp or the ground electric potential GND. The border between the groups B0 and B1 is arbitrary. The groups that result from the division are not limited to two groups, the groups B0 and B1, and it is also possible that the division into three or more groups are performed. In a case where the division into the three or more groups is performed, for example, as a value of the compensation voltage Vcmp approaches the row control circuit 202, the value of the compensation voltage Vcmp may be increased.

Furthermore, it is also possible that the value of the compensation voltage Vcmp is set for every word line WL according to a difference between the width of the effective writing pulse that is applied to the memory cell MC in the group B0 and the width of the effective writing pulse that is applied to the memory cell MC in the group B1. For example, when the difference is great, the value of the compensation voltage Vcmp may be increased, and when the difference is small, the value of the compensation voltage Vcmp may be decreased.

Figure 3:
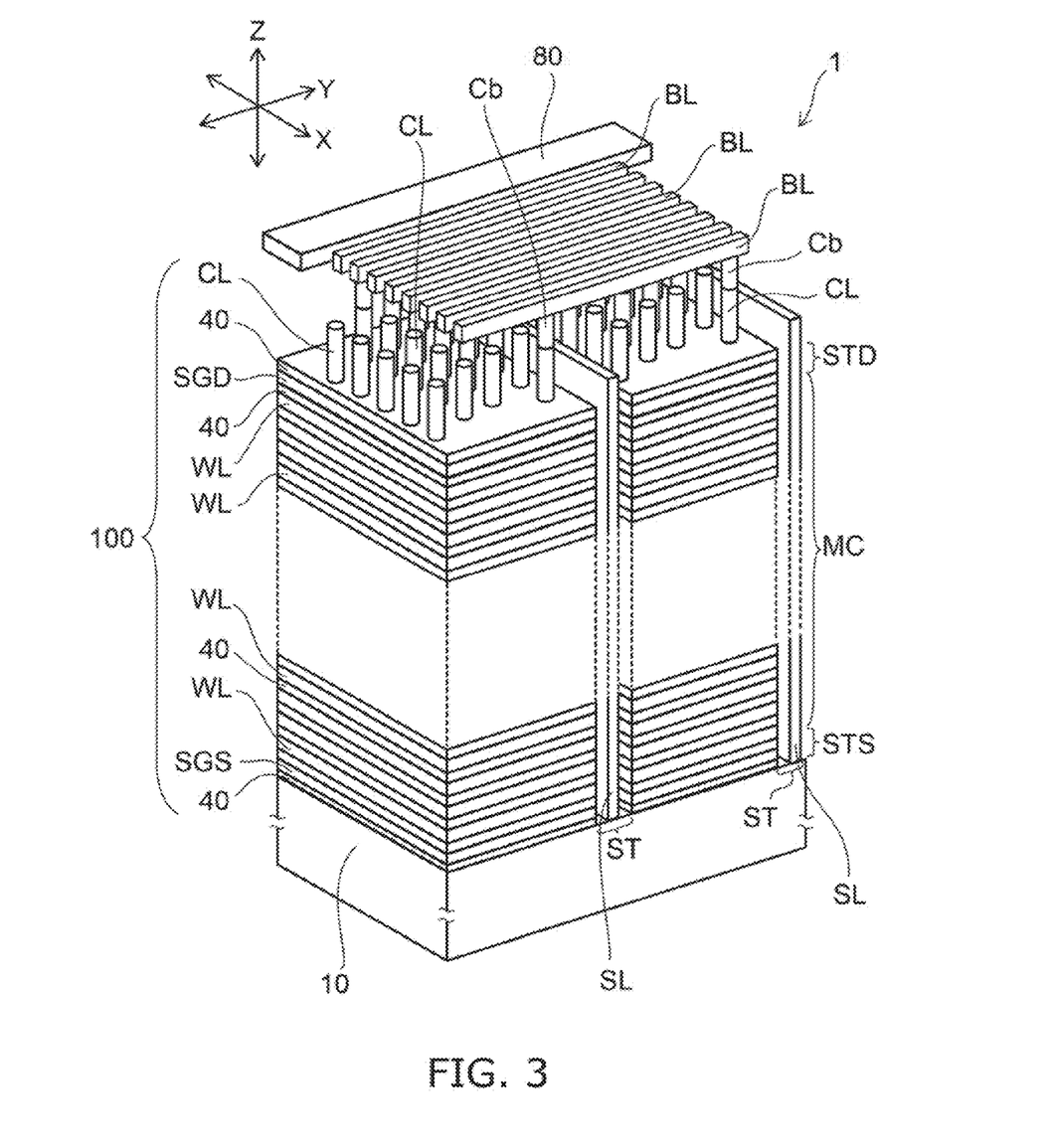
FIG. 3 is a schematic perspective diagram of the memory cell array of the semiconductor device of the embodiment.

FIG. 3 is a schematic perspective diagram of the memory cell array 1 of the semiconductor device of the embodiment. As illustrated in FIG. 3, the memory cell array 1 has a stacked body 100, a plurality of column portions CL, and a plurality of slits ST. The stacked body 100 includes a drain-side selection gate SGD, a plurality of word lines WL, and a source-side selection gate SGS.

The source-side selection gate SGS is provided on a substrate 10. The substrate 10, for example, is a semiconductor substrate. The semiconductor substrate, for example, contains silicon. The plurality of word lines WL is provided on the source-side selection gate SGS. The drain-side selection gate SGD is provided on the plurality of word lines WL. The drain-side selection gate SGD, the plurality of word lines WL, and the source-side selection gate SGS are electrode layers. The number of stacked layers in the electrode layer is arbitrary.

The electrode layers (SGD, WL, and SGS) are stacked up in a state of being separated from each other. An insulating body 40 is disposed between the electrode layers (SGD, WL, and SGS). The insulating body 40 may be an insulating material, such as a silicon oxide film, and may be an air gap. The stacked body 100 alternately includes the insulating body 40 and the electrode layers (SGD, WL, and SGS).

At least one of the drain-side selection gates SGD is set to be a gate electrode of the drain-side selection transistor STD. At least one of the source-side selection gates SGS is set to be a gate electrode of the source-side selection transistor STS. A plurality of memory cells MC are serially connected between the drain-side selection transistor STD and the source-side selection transistor STS. One of the word lines WL is set to be a gate electrode of the memory cell MC.

The slit ST is provided within the stacked body 100. The slit ST extends in the stacking direction (the Z-direction) and the X-direction within the stacked body 100. The slit ST separates the stacked body 100 into a plurality of areas in the Y-direction. The areas that result of the division by the slit ST is referred to as a "block".

The source line SL is disposed within the slit ST. The source line SL is a conductive material. The source line SL is insulated from the stacked body 100, and for example, extends in the shape of a plate in the Z-direction and the X-direction. A high-layer interconnection 80 is disposed over the source line SL. The high-layer interconnection 80 extends in the Y-direction. The high-layer interconnection 80 is electrically connected with a plurality of source lines SL that run side by side along the Y-direction.

The column portion CL is provided within the stacked body 100 that is separated by the slit ST. The column portion CL extends in the stacking direction (the Z-direction). The column portion CL, for example, is formed in the shape of a circular column or in the shape of an elliptic circular column. The column portion CL is disposed, for example, in the shape of a hound's tooth or in the shape of a square lattice, within the memory cell array 1. The drain-side selection transistor STD, the plurality of memory cells MC, and the source-side selection transistor STS are disposed in the column portion CL.

A plurality of bit lines BL are disposed over an upper end portion of the column portion CL. The plurality of bit lines BL extend in the Y-direction. The upper end portion of the column portion CL is electrically connected with one of the bit lines BL through a contact portion Cb. The one bit line BL is electrically connected with the column portion CL that is selected one by one from each block.

Figure 4:
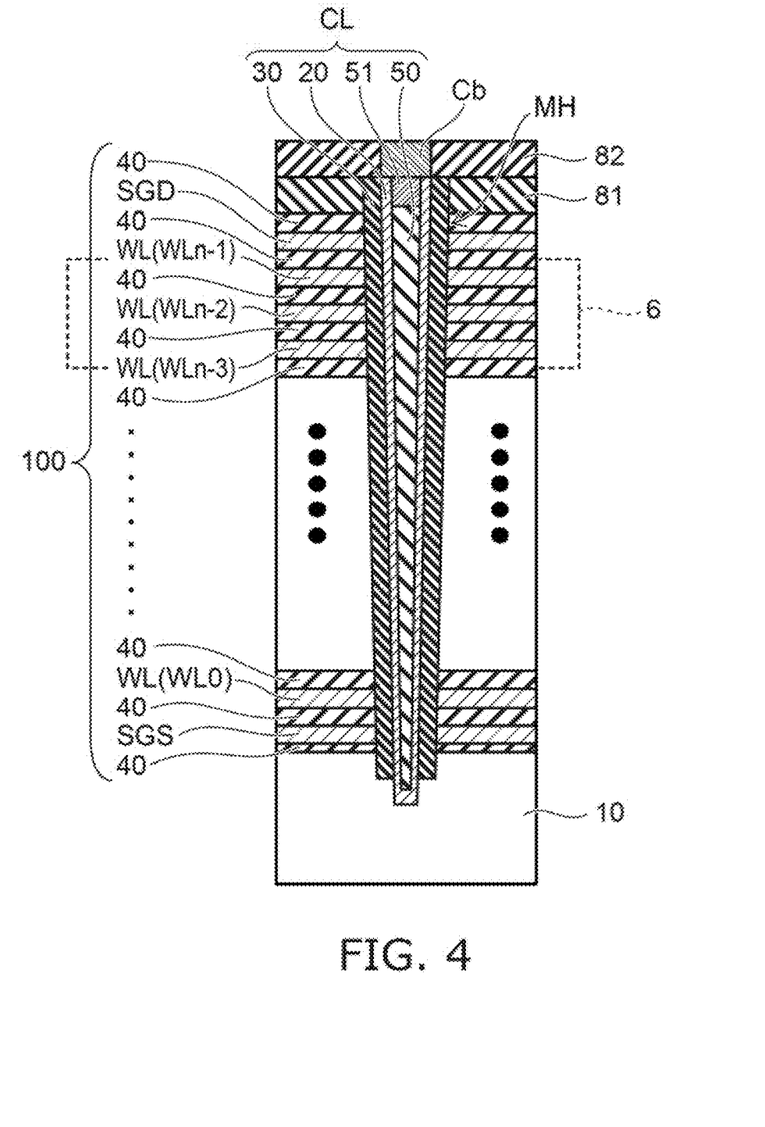
FIG. 4 is a schematic cross-sectional diagram of the column portion of the semiconductor device of the embodiment.
Figure 5:
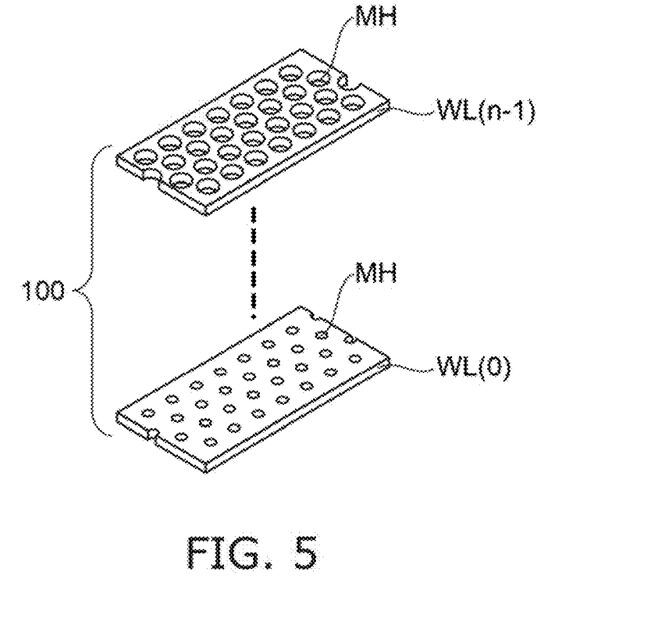
FIG. 5 is a schematic perspective diagram of the word line WL in the uppermost layer and the word line WL in the lowermost layer.
Figure 6:
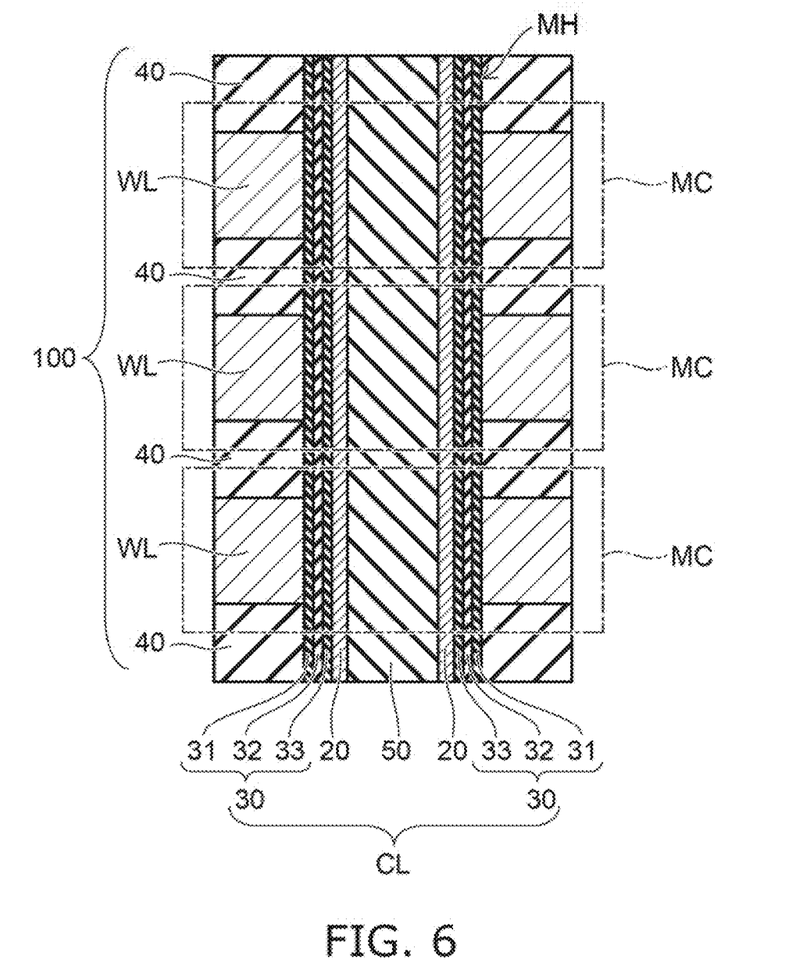
FIG. 6 is a schematic cross-sectional diagram that results from enlarging a portion that is indicated by a dashed-line frame 6 in FIG. 4.

FIG. 4 is a schematic cross-sectional diagram of the column portion CL of the semiconductor device of the embodiment. FIG. 5 is a schematic perspective diagram of the word line WL(n−1) in the uppermost layer and the word line WL(0) in the lowermost layer. FIG. 6 is a schematic cross-sectional diagram that results from enlarging a portion that is indicated by a dashed-line frame 6 in FIG. 4. FIG. 4 corresponds to a cross section that is in parallel with a Y-Z surface in FIG. 2.

As illustrated in FIGS. 4 to 6, the column portion CL is provided within a memory hole (open hole) MH. The memory hole MH is provided within the memory cell array 1 of the stacked body 100. The memory hole MH extends along the stacking direction (the Z-direction) of the stacked body 100 within the stacked body 100. The column portion CL includes a memory film 30, a semiconductor body 20, and a core layer 50.

The memory film 30 is provided on an internal wall of the memory hole MH. The memory film 30, for example, is in the shape of a cylinder. The memory film 30 includes a block insulating film 31, an electric charge accumulation film 32, and a tunnel insulation film 33.

The block insulating film 31 is provided on the internal wall of the memory hole MH. The block insulating film 31, for example, contains silicon oxide.

The electric charge accumulation film 32 is provided on the block insulating film 31. The electric charge accumulation film 32, for example, contains silicon oxide. The electric charge accumulation film 32 has a trapping site that traps electric charge, and traps the electric charge in the film. The threshold voltage of the memory cell MC changes depending on the presence or absence of the trapped electric charge and an amount of trapped electric charge. Accordingly, the memory cell MC retains information.

The tunnel insulation film 33 is provided on the electric charge accumulation film 32. The tunnel insulation film 33, for example, contains silicon oxide, or silicon oxide and silicon nitride. The tunnel insulation film 33 is an electric potential barrier between the electric charge accumulation film 32 and the semiconductor body 20. When the electric charge is caused to be implanted from the semiconductor body 20 into the electric charge accumulation film 32 (a writing operation), and when the electric charge is emitted from the electric charge accumulation film 32 to the semiconductor body 20 (an erasing operation), in the tunnel insulation film 33, the electric charge is tunneled.

Within the stacked body 100, the electrode layers (SGD, WL, and SGS) are provided on the memory film 30. The electrode layers (SGD, WL, and SGS), for example, contain tungsten.

The semiconductor body 20 is provided on the memory film 30 that is opposite in direction to the electrode layers (SGD, WL, and SGS). The semiconductor body 20, for example, contains silicon. Silicon, for example, is polysilicon that results from crystallizing amorphous silicon. A conductivity type of silicon, for example, is a P-type. The shape of the semiconductor body 20, for example, is the shape of a cylinder that has the bottom. The semiconductor body 20, for example, is electrically connected with the substrate 10.

The core layer 50 is provided on the semiconductor body 20. The core layer 50 has insulating property. The core layer 50, for example, contains silicon oxide. The core layer 50 is in the shape of a column. A cap layer 51 is provided on the upper face of the core layer 50. The cap layer 51, for example, contains silicon. Silicon, for example, is polysilicon that results from crystallizing amorphous silicon. A conductivity type of silicon, for example, is an N-type. The cap layer 51 is electrically connected with the semiconductor body 20 in an upper portion of the memory hole MH.

The memory hole MH is buried in the memory film 30, the semiconductor body 20, the core layer 50, and the cap layer 51.

A first insulating film 81 and a second insulating film 82 are provided on an upper surface of the stacked body 100. The first insulating film 81 is provided on the stacked body 100. The second insulating film 82 is provided on the first insulating film 81. The contact portion Cb is provided within the second insulating film 82. The contact portion Cb, for example, is electrically connected with the semiconductor body 20 and the cap layer 51.

In this manner, in the memory cell array 1 of the semiconductor device of the embodiment, within the same word line WL, a plurality of memory holes MH are formed, and the memory cell MC is formed. The memory cells MC are stacked up, having the columns CL, which extend in the Z-direction, in common, in order to form the memory string MS. More precisely, a plurality of memory strings MS that have the word lines WL, which are stacked up, in common, are formed in matrix form on the substrate 10.

Operation of the semiconductor device of the embodiment is described. The writing operation is performed based on a per-page (word line) basis. In one page, for example, the memory cell MC that causes the threshold voltage to be shifted (the writing selection) and the memory cell MC that does not cause the threshold voltage to be shifted (the writing suppression) are present in a mixed manner.

<Writing Selection>

The memory cell MC that is selected for writing causes the threshold voltage thereof to be shifted, for example, from data "1 (for example, an erased state)" to data "0". In this case, the voltage of the bit line BL, for example, is set to be the compensation voltage Vcmp in the group B0 and the ground electric potential GND in the group B1. In the memory cell MC that is selected for writing, electric charge (an electron) is caused to be implanted into the electric charge accumulation film 32, and the threshold voltage is shifted in the positive direction. Accordingly, data "0" is programmed into the memory cell MC that is selected for writing.

<Writing Suppression>

The writing-suppressed memory cell MC keeps the threshold voltage thereof adjusted to data "1 (for example, the erased state)". In this case, in both of the groups B0 and B1, the voltage of the bit line BL, for example, is set to be the power source voltage Vcc. In the writing-suppressed memory cell MC, electric charge (an electron) is not caused to be implanted into the electric charge accumulation film 32. For this reason, the threshold voltage keeps its original state. Accordingly, the writing-suppressed memory cell MC, for example, keeps data "1".

In the memory cell MC that is selected for writing, electric charge (an electron) is not caused to be excessively introduced into the electric charge accumulation film 32. In a case where the electric charge is caused to be excessively introduced into the electric charge accumulation film 32, the threshold voltage of the memory cell is shifted in the direction of increasing the threshold voltage. Within the same word line WL, because waveforms of voltages that are applied to the gate electrodes are different, there may be a difference in an amount of shift in the threshold voltage, according to the distance from the row control circuit 202, that is, the resistance value of the word line WL.

In a case where the selected word line WL is in the group G0, the row driver 211 outputs the program voltage Vpgm0.

In the group B0 and the group G0, a voltage V00 that is applied between the gate electrode of the memory cell MC that is selected for writing and the semiconductor body is "Vpgm0-Vcmp". A voltage that is applied between the gate electrode of the writing-suppressed memory cell MC and the semiconductor body is "Vpgm0-Vboost".

In the group B1 and the group G0, a voltage V10 that is applied between the gate electrode of the memory cell MC that is selected for writing and the semiconductor body is "Vpgm0-GND". A voltage that is applied between the gate electrode of the writing-suppressed memory cell MC and the semiconductor body is "Vpgm0-Vboost".

In a case where the selected word line WL is in the group G1, the row driver 211 outputs the program voltage Vpgm1.

In the group B0 and the group G1, a voltage V01 that is applied between the gate electrode of the memory cell MC that is selected for writing and the semiconductor body is "Vpgm1-Vcmp". The voltage that is applied between the gate electrode of the writing-suppressed memory cell MC and the semiconductor body is "Vpgm1-Vboost".

In the group B1 and the group G1, a voltage V11 that is applied between the gate electrode of the memory cell MC that is selected for writing and the semiconductor body is "Vpgm1-GND". The voltage that is applied between the gate electrode of the writing-suppressed memory cell MC and the semiconductor body is "Vpgm1-Vboost".

According to the above description, V00<V10 and V01<V11 can be established. Vpgm0 and Vpgm1 are adjusted to suitable values for selection, and thus V10=V01 can be established and V10<V01 can be established. A relationship between these voltages can be suitably set according to a structure, a size, and the like of the memory cell array 1.

The voltages V00 to V11 that are applied between the gate electrode of the memory cell MC and the semiconductor body 20 that forms the channel can absorb a difference in the waveform of the applied voltage that is based on the distance from the row control circuit 202, and the amount of shift in the threshold voltage for every memory cell that is selected can be set to be approximately the same.

In the same memory string MS, in a case where the compensation voltage Vcmp is set for every word line WL, the following are performed.

For example, the memory cell MC (i−1, 0) to the MC memory cell MC (i−1, n−1) in the memory string MS (i−1) are sequentially selected and data is written.

For example, the memory cell MC (i−1, j−1) is selected and data is written. In this case, the compensation voltage generating circuit 220b of the column driver 220 is set to output the compensation voltage Vcmp that is set in advance for the memory cell MC (i−1, j−1).

After the writing to the memory cell MC (i−1, j−1) is ended, a next memory cell MC (i−1, j) is selected, and data is written. In this case, the compensation voltage generating circuit 220b of the column driver 220 is set to output the compensation voltage Vcmp that is set in advance for the memory cell MC (i−1, j).

When this is done, the compensation voltage Vcmp, which is set in advance, is supplied to the bit line for every memory cell MC that is connected with a different word line.

Operation and an effect of the semiconductor device of the embodiment are described in comparison with operation of a semiconductor device in a comparative example.

Figure 7:
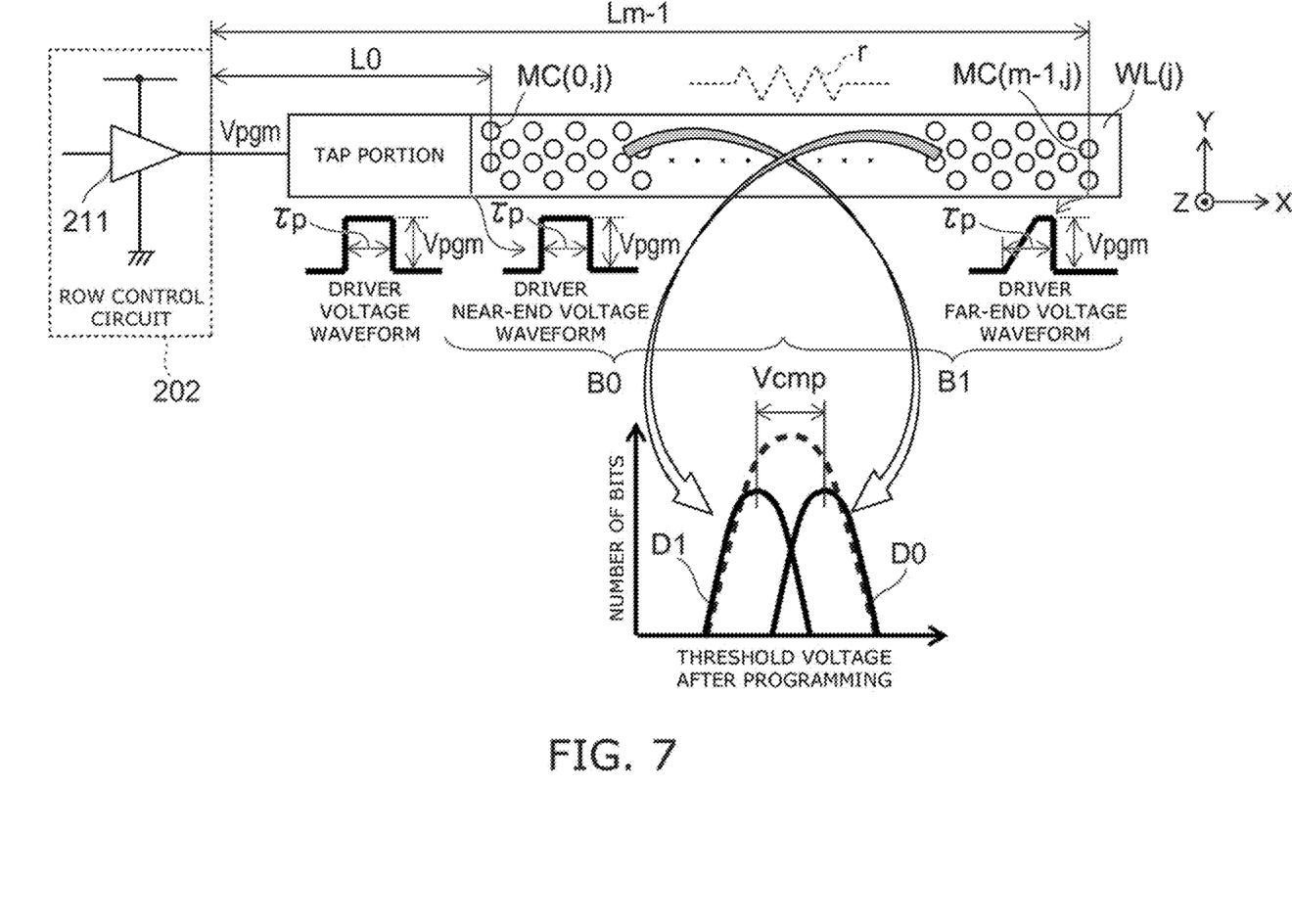
FIG. 7 is a schematic diagram for describing the operation of the semiconductor device in the comparative example.

FIG. 7 is a schematic diagram for describing the operation of the semiconductor device in the comparative example.

In the semiconductor device in the comparative example, regardless of a separation distance from the row control circuit 202, the ground electric potential GND is supplied to a selection bit line.

As illustrated in FIG. 7, the word line WL is connected with the output of the row control circuit 202 through a tap portion. The word line WL has a width in the Y-direction and extends in the X-direction. The row control circuit 202 is connected with one end in the X-direction, of the word line WL. The word line WL extends in the X-direction, and the memory cell MC that has the word line in common is driven with the fixed program voltage Vpgm through the word line WL.

Therefore, the waveform of the voltage that drives the gate electrode of the memory cell MC changes according to a resistance value r in the X-direction, of the word line WL(j). The resistance value r increases toward a positive direction of the X-direction. Because an influence of the resistance value r of the word line WL on the memory cell MC (0, j) that is disposed the closest to the row control circuit 202 is small, a voltage waveform that is close to a waveform of a voltage that is output from the row control circuit 202 is applied.

A waveform of a voltage for the memory cell MC (m−1,j) that is disposed in a position which is separated the farthest from the row control circuit 202 is blunt due to the resistance value r of the word line WL(j). The word line WL(j) is driven by the same row driver 211. For this reason, a pulse width τp is almost the same in a position of the memory cell MC (0, J) and a position of the memory cell MC (m−1, j). However, in the position of the memory cell MC (m−1, j), an effective writing pulse width is narrowed as much as the voltage waveform is blunt due to the resistance value r of the word line, in comparison with the position of the memory cell MC (0, j).

In the memory cell MC (0, j) in which it is difficult for the voltage waveform of the word line to be blunt, and the effective writing pulse width is difficult to narrow, the amount of shift in the threshold voltage tends to be increased. For this reason, in the group B0 that includes the memory cell MC (0, j), a distribution of the post-shift threshold voltage, for example, becomes like a distribution D0 in the drawing. On the other hand, in the memory cell MC (m−1, j) in which the effective writing pulse width is easy to narrow, the amount of shift in the threshold voltage tends to be decreased. For this reason, in the group B1 that includes the memory cell MC (m−1, j), the distribution of the post-shift threshold voltage becomes like a distribution D1 in the drawing. It is noted that a distribution D which is represented by a dashed line indicates a distribution of the threshold voltage in a case where both of the groups B0 and B1 are included.

In the semiconductor device of the embodiment, as described above, amplitude of a voltage between the gate electrode and the semiconductor body that forms the channel is changed according to a distance between the memory cell MC and the row control circuit 202. In the memory string MS in the group B0, of which a distance from the row control circuit 202 is short, the voltage of the selection bit line BL is set to be higher by the compensation voltage Vcmp than the voltage of the selection bit line in the memory string MS in the group B1, of which a distance from the row control circuit 202 is remote.

The compensation voltage Vcmp, for example, can be set as follows.

In a case where the compensation voltage Vcmp is set to 0 V, the compensation voltage Vcmp is set based on a distribution of the amount of shift in the threshold voltage. More specifically, the compensation voltage Vcmp is set to be a difference between an average value of the distribution D0 of the amount of shift in the threshold voltage of the memory cell in the group B0, of which the distance from the row control circuit 202 is the shortest, and an average value of the distribution D1 of the amount of shift of the threshold voltage of the memory cell in the group B1, of which the distance from the row control circuit 202 is the remotest.

With this setting, the distribution of the amount of shift in the threshold voltage of the memory cell in the group, of which the distance from the row control circuit 202 is short can be set to be approximately the same as the distribution of the amount of shift in the threshold voltage of the memory cell, of which the distance from the row control circuit 202 is remote.

Therefore, the amount of shift in the threshold voltage of the memory cell in the group B0 can be set to be approximately the same as the amount of shift in the threshold voltage of the memory cell in the group B1, and a variance in the amount of shift in the threshold voltage of the memory cell is caused to be decreased. For this reason, a defective that is judged against a standard value of the threshold voltage can be prevented from occurring, and thus operation stability can be much more improved.

The memory hole MH is large in terms of an aspect ratio. For this reason, the memory hole MH is difficult to process vertically down to the bottom. Therefore, as illustrated in FIG. 5, a diameter of the memory hole MH is small on the low layer side of the stacked body 100, and is larger on the upper layer side of the stacked body 100. As a result of the resistance value of the word line WL, for example, is the highest in the word line WL (n−1) in the uppermost layer, and is the lowest in the word line WL(0) in the lowermost layer.

Additionally, an electric field of the tunnel film is caused to be changed depending on whether the diameter of the memory hole MH is large or small. For this reason, the amount of shift of the threshold voltage of the memory cell MC in the lower layer tends to be larger than the amount of shift of the threshold voltage of the memory cell MC in the upper layer.

The program voltage Vpgm0 that is applied to the word line in the group G0 in the lower layer is made to be lower than the program voltage Vpgm1 that is applied to the word line in the group G1 in the upper layer, and thus these situations can be eliminated.

Additionally, in the embodiment, according to the distance from the row control circuit 202, a voltage that is supplied to the bit line BL that is selected for writing, for example, is caused to be changed like the compensation voltage Vcmp and the ground electric potential GND. Accordingly, the dispersion in the threshold voltage of the memory cell MC that occurs due to a difference in the distance from and to the row control circuit 202 can be eliminated.

The higher the resistance of the word line, the greater the difference in the effective writing pulse width between the group B0 and the group B1. For this reason, the value of the compensation voltage Vcmp needs to be higher.

On the other hand, for the purpose of processing, the diameter of the memory hole MH is small in the lower layer, and is larger in the upper layer. For the word line in the upper layer, in comparison with the word line in the lower layer, a cubic volume of a metal material is reduced as much as the memory hole MH is increased, and thus resistance is increased. So, according to the position of the word line in the stacking direction, the value of the compensation voltage Vcmp when selecting the word line in the upper layer may be higher than the value of the compensation voltage Vcmp when selecting the word line in the lower line. For example, when selecting the word line in the group G0 in the lower layer, setting to a compensation voltage Vcmp0 takes place, and when selecting the word line in the group G1 in the upper layer, setting a compensation voltage Vcmp1 takes place. A relationship between the compensation voltage Vcmp0 and the compensation voltage Vcmp1 is set to be as follows.

Vcmp 0<Vcmp 1

When setting to this relationship takes place, for example, it is possible that both of
the increase in the dispersion in the threshold voltage due to the difference in the distance from the row control circuit 202, and
the increase in the dispersion in the threshold voltage due to the position of the word line in the stacking direction are suppressed in the same time.

With progress in miniaturization, dispersion in the thickness of the word line WL, dimensional accuracy, or the like tends to be apparent. In the semiconductor device of the embodiment, in the same memory string MS, the compensation voltage Vcmp that is suitable for every word line can be set in advance, and switching to the compensation voltage Vcmp that is set when the writing to the memory cell is performed is caused to take place and thus data can be written as well. For this reason, the dispersion in the amount of shift in the threshold voltage due to a dispersion during manufacturing can be suppressed, and an improvement in stability of operation can be achieved.

By doing this, dispersion in the resistance value due to dispersion during manufacturing, such as dispersion in a dimensional accuracy or resistance ratio of the word line WL, can be absorbed. Therefore, it is possible that a yield is improved.

According to the embodiment, the semiconductor device that can suppress the dispersion in the threshold voltage when writing is performed can be provided.

The embodiment of the invention is described above with reference to the example. However, embodiments are not limited to the embodiment described above, and the embodiment described above is not the only embodiment. The embodiment can find application in a planar-type memory device.

Furthermore, the embodiment that can suppress the increase in the threshold voltage of the memory cell MC due to the difference in the voltage waveform when writing is performed is effective in a multi-value memory in which information that represents two or more values is stored in one memory cell MC.

Additionally, the invention is not limited to these examples. For example, a specific configuration of each element, such as a first memory cell, a second memory cell, a first word line, a first bit line, a second bit line, a source line, or a row control circuit falls within the scope of the invention, as long as a person of ordinary skill in the related art can implement the invention in the same manner and can obtain the same effect by suitably making a selection from the known range.

Any example that results from combining two or more of the elements within a technically-possible range falls within the scope of the invention as long as the example includes the gist of the invention.

All semiconductor devices that are suitably design-changed and can be implemented by a person of ordinary skill in the related art based on the semiconductor device described above as the embodiment of the invention fall within the scope of the invention, as long as they include the gist of the invention.

In a category to which the technical idea behind the invention belongs, if a person of ordinary skill in the related art can contemplate various variations and modifications, these variations and modifications are understood as falling within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising;
first memory cells each having a first gate electrode and a first channel having one end and an other end;
second memory cells each having a second gate electrode and a second channel having one end and an other end;
a first word line including a tap portion electrically connected to each of the first gate electrode and the second gate electrode of the first memory cells and the second memory cells;
a first bit line electrically connected to the one end of the first channel of any one of the first memory cells;
a second bit line electrically connected to the one end of the second channel of any one of the second memory cells;
a source line electrically connected to each of the other ends of the first channels of the first memory cells and the other ends of the second channels of the second memory cells; and
a control circuit connected to the tap portion of the first word line, the first bit line, and the second bit line, wherein
a distance between the tap portion and the first bit line is shorter than a distance between the tap portion and the second bit line, and
when a data is written to the first memory cells and the second memory cells, a first voltage lower than a writing suppression voltage applied to a non-selected third bit line is applied to the first bit line, a second voltage lower than the first voltage is applied to the second bit line, and a first program voltage higher than the first voltage and the second voltage is applied to the first word line by the control circuit to cause each threshold voltage of the any one of the first memory cells and the any one of the second memory cells to be shifted.

2. The device according to claim 1, wherein
a first length between the tap portion and the first channel of any one of the first memory cells is shorter than a second length between the tap portion and the second channel of any one of the second memory cells.

3. The device according to claim 1, wherein
a resistance value between the tap portion and the first gate electrode of any one of the first memory cells is lower than a resistance value between the tap portion and the second gate electrode of any one of the second memory cells.

4. The device according to claim 1, further comprising:
third memory cells stacked above the first memory cells, the third memory cells each having a third gate electrode and a third channel having one end and an other end, the third channel being serially connected between the first channel and the first bit line; and a second word line electrically connected to the third gate electrode and the control circuit, wherein a third voltage different from the first voltage is applied to the first bit line when a data is written to the third memory cells to cause a threshold voltage of a selected third memory cell of the third memory cells to be shifted, the one end of the third channel of the selected third memory cell being electrically connected to the first bit line.

5. The device according to claim 4, further comprising:
fourth memory cells stacked above the second memory cells, the fourth memory cells each having a fourth gate electrode and a fourth channel having one end and an other end, the fourth channel being serially connected between the second channel and the second bit line, wherein, the second word line is further connected to the fourth gate electrode, when a data is written to the third memory cells and the fourth memory cells, the third voltage is applied to the first bit line, a fourth voltage lower than the third voltage is applied to the second bit line, and a second program voltage higher than the third voltage and the fourth voltage is applied to the second word line by the control circuit to cause each threshold voltage of the selected third memory cell and a selected fourth memory cell of the fourth memory cells to be shifted, the one end of the fourth channel of the selected fourth memory cell being electrically connected to the second bit line.

6. The device according to claim 5, wherein
the second program voltage is different from the first program voltage.

7. The device according to claim 5, wherein a difference between the third voltage and the fourth voltage is greater than a difference between the first voltage and the second voltage.

8. The device according to claim 7, wherein
a first electrode layer including the first gate electrode and the second gate electrode, and a second electrode layer including the third gate electrode and the fourth gate electrode are stacked with insulator interposed, a first semiconductor body including the first channel and the third channel penetrates through the first electrode layer and the second electrode layer in a stacking direction of the first electrode layer and the second electrode layer, and a second semiconductor body including the second channel and the fourth channel penetrates through the first electrode layer and the second electrode layer in the stacking direction.

9. The device according to claim 8, wherein
a resistance value of the second electrode layer is higher than a resistance value of the first electrode layer.

10. The device according to claim 1, wherein
first gate electrodes of the first memory cells are disposed between second gate electrodes of the second memory cells and the tap portion, the first bit line belongs to a first bit line group electrically connected to first channels of the first memory cells, and the second bit line belongs to a second bit line group electrically connected to second channels of the second memory cells, and when a data is written to the first memory cells and the second memory cells, the first voltage is applied to the first bit line group commonly, the second voltage lower than the first voltage is applied to the second bit line group commonly, and the first program voltage higher than the first voltage and the second voltage is applied to the first word line by the control circuit to cause each threshold voltage of selected first memory cells and selected second memory cells to be shifted.

11. The device according to claim 1, wherein the writing suppression voltage is a power source voltage.

12. A semiconductor device comprising:
first memory cells each having a first gate electrode and a first channel having one end and an other end;

second memory cells each having a second gate electrode and a second channel having one end and an other end;

a first word line including a tap portion electrically connected to each of the first gate electrode and the second gate electrode of the first memory cells and the second memory cells;

a first bit line electrically connected to the one end of the first channel of any one of the first memory cells;

a second bit line electrically connected to the one end of the second channel of any one of the second memory cells;

third memory cells stacked above the first memory cells, the third memory cells each having a third gate electrode and a third channel having one end and an other end, the third channel being serially connected between the first channel and the first bit line;

a second word line electrically connected to the third gate electrode, a source line electrically connected to each of the other ends of the first channels of the first memory cells, the other ends of the second channels of the second memory cells, and the other ends of the third channels of the third memory cells; and a control circuit connected to the tap portion of the first word line, the first bit line, the second bit line, and the second word line, wherein a distance between the tap portion and the first bit line is shorter than a distance between the tap portion and the second bit line, when a data is written to the first memory cells and the second memory cells, a first voltage is applied to the first bit line, a second voltage lower than the first voltage is applied to the second bit line, and a first program voltage higher than the first voltage and the second voltage is applied to the first word line by the control circuit to cause each threshold voltage of the any one of the first memory cells and the any one of the second memory cells to be shifted, and a third voltage different from the first voltage is applied to the first bit line when a data is written to the third memory cells to cause a threshold voltage of a selected third memory cell of the third memory cells to be shifted, the one end of the third channel of the selected third memory cell being electrically connected to the first bit line.

13. The device according to claim 12, further comprising:
fourth memory cells stacked above the second memory cells, the fourth memory cells each having a fourth gate electrode and a fourth channel having one end and an other end, the fourth channel being serially connected between the second channel and the second bit line, wherein, the second word line is further connected to the fourth gate electrode, when a data is written to the third memory cells and the fourth memory cells, the third voltage is applied to the first bit line, a fourth voltage lower than the third voltage is applied to the second bit line, and a second program voltage higher than the third voltage and the fourth voltage is applied to the second word line by the control circuit to cause each threshold voltage of the selected third memory cell and a selected fourth memory cell of the fourth memory cells to be shifted, the one end of the fourth channel of the selected fourth memory cell being electrically connected to the second bit line.

14. The device according to claim 13, wherein the second program voltage is different from the first program voltage.

15. The device according to claim 13, wherein a difference between the third voltage and the fourth voltage is greater than a difference between the first voltage and the second voltage.

16. The device according to claim 15, wherein
a first electrode layer including the first gate electrode and the second gate electrode, and a second electrode layer including the third gate electrode and the fourth gate electrode are stacked with insulator interposed,
a first semiconductor body including the first channel and the third channel penetrates through the first electrode layer and the second electrode layer in a stacking direction of the first electrode layer and the second electrode layer, and
a second semiconductor body including the second channel and the fourth channel penetrates through the first electrode layer and the second electrode layer in the stacking direction.

17. The device according to claim 16, wherein a resistance value of the second electrode layer is higher than a resistance value of the first electrode layer.

* * * * *